(12) United States Patent
Zhang et al.

(10) Patent No.: US 11,769,796 B2
(45) Date of Patent: Sep. 26, 2023

(54) HYBRID COMPLEMENTARY METAL-OXIDE SEMICONDUCTOR FIELD EFFECT TRANSISTOR NANOSHEET DEVICE

(71) Applicant: International Business Machines Corporation, Armonk, NY (US)

(72) Inventors: Chen Zhang, Guilderland, NY (US); Ruilong Xie, Niskayuna, NY (US); Tenko Yamashita, Schenectady, NY (US)

(73) Assignee: International Business Machines Corporation, Armonk, NY (US)

( * ) Notice: Subject to any disclaimer, the term of this patent is extended or adjusted under 35 U.S.C. 154(b) by 57 days.

(21) Appl. No.: 17/463,688

(22) Filed: Sep. 1, 2021

(65) Prior Publication Data
US 2023/0060790 A1    Mar. 2, 2023

(51) Int. Cl.
*H01L 29/06* (2006.01)
*H01L 29/10* (2006.01)
*H01L 29/66* (2006.01)

(52) U.S. Cl.
CPC ...... *H01L 29/0665* (2013.01); *H01L 29/1029* (2013.01); *H01L 29/66553* (2013.01)

(58) Field of Classification Search
CPC ............. H01L 29/0665; H01L 29/1029; H01L 29/0676; H01L 29/0673; H01L 29/42392; H01L 29/66545
See application file for complete search history.

(56) References Cited

U.S. PATENT DOCUMENTS

| | | | |
|---|---|---|---|
| 9,899,529 B2 | 2/2018 | Hong | |
| 9,941,118 B2 | 4/2018 | Leobandung | |
| 10,008,580 B2 | 6/2018 | Obradovic | |
| 10,332,803 B1* | 6/2019 | Xie | ........... H01L 29/42376 |
| 10,347,657 B1 | 7/2019 | Leobandung | |
| 10,892,331 B2 | 1/2021 | Yamashita | |
| 2021/0134949 A1 | 5/2021 | Xie | |

FOREIGN PATENT DOCUMENTS

| | | |
|---|---|---|
| CN | 108298583 B | 11/2019 |
| EP | 3182459 A1 | 6/2017 |

OTHER PUBLICATIONS

Jiang et al., "Comprehensive simulation study of direct source-to-drain tunneling in ultra-scaled Si, Ge, and III-V DG-FETs," IEEE Transactions on Electron Devices, vol. 64, No. 3, 2017, pp. 945-952.

* cited by examiner

*Primary Examiner* — Yara B Green
*Assistant Examiner* — Fakeha Sehar
(74) *Attorney, Agent, or Firm* — David K. Mattheis

(57) ABSTRACT

A semiconductor device formed by forming a stack of alternating horizontal nanosheet layers, recessing the stack for an n-type field effect transistor (nFET), growing crystalline semiconductor adjacent to the stack, forming vertical nanosheets from the crystalline semiconductor, forming inner spacers between the vertical nanosheets, and forming a high-k metal gate structure around the horizontal nanosheets and the vertical nanosheets.

14 Claims, 15 Drawing Sheets

HYBRID COMPLEMENTARY METAL-OXIDE SEMICONDUCTOR FIELD EFFECT TRANSISTOR NANOSHEET DEVICE

BACKGROUND

The disclosure relates generally to complementary metal-oxide semiconductor field effect transistor (CMOSFET) devices. The disclosure relates particularly to CMOSFET pairs having horizontal n-FET channels, and vertical p-FET channels.

Integrated circuit (IC) chips are formed on semiconductor wafers at increasingly smaller scale. In current technology nodes, transistor devices are constructed as three-dimensional (3D) field effect transistor (FET) structures. Nanosheet technology is well positioned for carrying FET structures beyond FinFET logic technology as it has excellent power performance and area scaling properties. Much of this is due to the large Weff per footprint offered by nanosheet structures.

SUMMARY

The following presents a summary to provide a basic understanding of one or more embodiments of the disclosure. This summary is not intended to identify key or critical elements or delineate any scope of the particular embodiments or any scope of the claims. Its sole purpose is to present concepts in a simplified form as a prelude to the more detailed description that is presented later.

In one aspect, a semiconductor device formed by forming a stack of alternating horizontal nanosheet layers, recessing the stack for an n-type field effect transistor (nFET), growing crystalline semiconductor adjacent to the stack, forming vertical nanosheets from the crystalline semiconductor, forming inner spacers between the vertical nanosheets, and forming a high-k metal gate structure around the horizontal nanosheets and the vertical nanosheets.

In one aspect, a semiconductor structure includes a first field effect transistor (FET), the first FET comprising a first plurality of nanosheets having a horizontal orientation and a first separation pitch, a second FET disposed adjacent to the first FET, the second FET comprising a second plurality of nanosheets having a vertical orientation and a similar separation pitch with inner dielectric spacers disposed between the second plurality of nanosheets.

In one aspect, a semiconductor structure includes an n-type field effect transistor (nFET), the nFET including a first plurality of horizontal nanosheets disposed at a first pitch, a p-type FET (pFET), the pFET including a second plurality of vertical nanosheets disposed at the first pitch, with inner dielectric spacers disposed between the second plurality of nanosheets.

BRIEF DESCRIPTION OF THE DRAWINGS

Through the more detailed description of some embodiments of the present disclosure in the accompanying drawings, the above and other objects, features and advantages of the present disclosure will become more apparent, wherein the same reference generally refers to the same components in the embodiments of the present disclosure.

DETAILED DESCRIPTION

Figure 1:
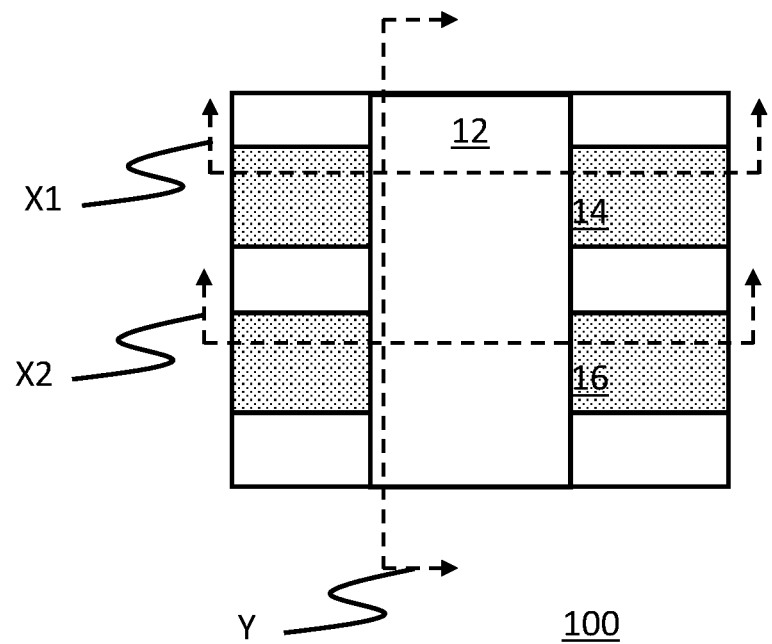
FIG. 1 provides a plan view of a semiconductor structure, according to an embodiment of the invention. The figure illustrates the section lines used in FIGS. 2-15.

Some embodiments will be described in more detail with reference to the accompanying drawings, in which the embodiments of the present disclosure have been illustrated. However, the present disclosure can be implemented in various manners, and thus should not be construed to be limited to the embodiments disclosed herein.

It is to be understood that aspects of the present invention will be described in terms of a given illustrative architecture; however, other architectures, structures, substrate materials and process features and steps can be varied within the scope of aspects of the present invention.

It will also be understood that when an element such as a layer, region or substrate is referred to as being "on" or "over" another element, it can be directly on the other element or intervening elements can also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements can be present. In contrast, when an element is referred to as being "directly connected" or "directly coupled" to another element, there are no intervening elements present.

The present embodiments can include a design for an integrated circuit chip, which can be created in a graphical computer programming language and stored in a computer storage medium (such as a disk, tape, physical hard drive, or virtual hard drive such as in a storage access network). If the designer does not fabricate chips or the photolithographic masks used to fabricate chips, the designer can transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein can be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher-level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should also be understood that material compounds will be described in terms of listed elements, e.g., SiGe. These compounds include different proportions of the elements within the compound, e.g., SiGe includes Si$_x$Ge$_{1-x}$ where x is less than or equal to 1, etc. In addition, other elements can be included in the compound and still function in accordance with the present principles. The compounds with additional elements will be referred to herein as alloys.

Reference in the specification to "one embodiment" or "an embodiment", as well as other variations thereof, means that a particular feature, structure, characteristic, and so forth described in connection with the embodiment is included in at least one embodiment. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This can be extended, as readily apparent by one of ordinary skill in this and related arts, for as many items listed.

The terminology used herein is for the purpose of describing particular embodiments only and is not tended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

Spatially relative terms, such as "beneath," "below," "lower," "above," "upper," and the like, can be used herein for ease of description to describe one element's or feature's relationship to another element(s) or feature(s) as illustrated in the FIGS. It will be understood that the spatially relative terms are intended to encompass different orientations of the device in use or operation in addition to the orientation depicted in the FIGS. For example, if the device in the FIGS. is turned over, elements described as "below" or "beneath" other elements or features would then be oriented "above" the other elements or features. Thus, the term "below" can encompass both an orientation of above and below. The device can be otherwise oriented (rotated 90 degrees or at other orientations and the spatially relative descriptors used herein can be interpreted accordingly. In addition, be understood that when a layer is referred to as being "between" two layers, it can be the only layer between the two layers, or one or more intervening layers cat also be present.

It will be understood that, although the terms first, second, etc., can be used herein to describe various elements, these elements should not be limited by these terms. These terms are only used to distinguish one element from another element. Thus, a first element discussed below could be termed a second element without departing from the scope of the present concept.

Deposition processes for the metal liner and sacrificial material include, e.g., chemical vapor deposition (CVD), physical vapor deposition (PVD), atomic layer deposition (ALD), or gas cluster ion beam (GCIB) deposition. CVD is a deposition process in which a deposited species is formed as a result of chemical reaction between gaseous reactants at greater than room temperature (e.g., from about 25° C. about 900° C.). The solid product of the reaction is deposited on the surface on which a film, coating, or layer of the solid product is to be formed. Variations of CVD processes include, but are not limited to, Atmospheric Pressure CVD (APCVD), Low Pressure CVD (LPCVD), Plasma Enhanced CVD (PECVD), and Metal-Organic CVD (MOCVD) and combinations thereof may also be employed. In alternative embodiments that use PVD, a sputtering apparatus may include direct-current diode systems, radio frequency sputtering, magnetron sputtering, or ionized metal plasma sputtering. In alternative embodiments that use ALD, chemical precursors react with the surface of a material one at a time to deposit a thin film on the surface. In alternative embodiments that use GCIB deposition, a high-pressure gas is allowed to expand in a vacuum, subsequently condensing into clusters. The clusters can be ionized and directed onto a surface, providing a highly anisotropic deposition.

One known problem with nanosheet complementary metal-oxide semiconductor (CMOS) FET structures is the current drivability of the pFET of the device. PFET current lag those of the nFET at the same voltage. This lag relates to the differences in electron (nFET) and hole (pFET) mobility in the respective devices. Whereas the typical horizontal nanosheet orientation used for the devices favors electron mobility, this orientation is unfavorable for hole mobility in the pFET devices.

The primary surface of horizontal nanosheets formed from crystalline semiconductor lattices lies along the (100) surface of the lattice, which favors electron mobility in the material, benefiting nFET current driveability. The primary surface of vertical nano sheets formed from crystalline semiconductor lattices lies along the (110) surface of the lattice, which favors hole mobility in the material, benefiting pFET current driveability.

For structures with three nanosheets each having a thickness t, a width W along the HKMG direction, and a disposed with a pitch including the thickness t and the spacing between two adjacent nanosheets of p, horizontal nanosheet structures have an effective width of $W_{eff}=3(2t+2W)$. Vertical nanosheets have a $W_{eff}=[(W-t)/p]*(t+6p)$ yielding comparable $W_{eff}$ between horizontal and vertical nanosheet structures.

Disclosed embodiments provide devices including nFETs having horizontal nanosheet orientations favoring nFET electron mobility, and pFETs having vertical nanosheet orientations favoring pFET hole mobility to provide optimized charge mobility for each portion of the CMOS combination. Each of the horizontal and vertical nanosheet sets include inner spacers between nanosheets electrically isolating the HKMG materials of the device from the source/drain regions of the device to prevent leakage current within the devices. The horizontal and vertical nanosheets are formed with similar spacing between the nanosheets to reduce die footprint area requirements.

Reference is now made to the figures. The figures provide schematic cross-sectional illustration of semiconductor devices at intermediate stages of fabrication, according to one or more embodiments of the invention. The figures provide front cross-sections and a side cross-section taken along section lines X1, X2, and Y of the plan view of FIG. 1. The figures provide schematic representations of the devices of the invention and are not to be considered accurate or limiting with regards to device element scale.

FIG. 1 provides a plan view of a CMOS device pair after fabrication steps disclosed herein. As shown in the Figure, gate structure 12, is disposed perpendicular to nanosheet stacks 14, and 16. Section lines Y, X1, and X2, indicate the viewpoints of the respective views of FIGS. 2-15.

Figure 2:
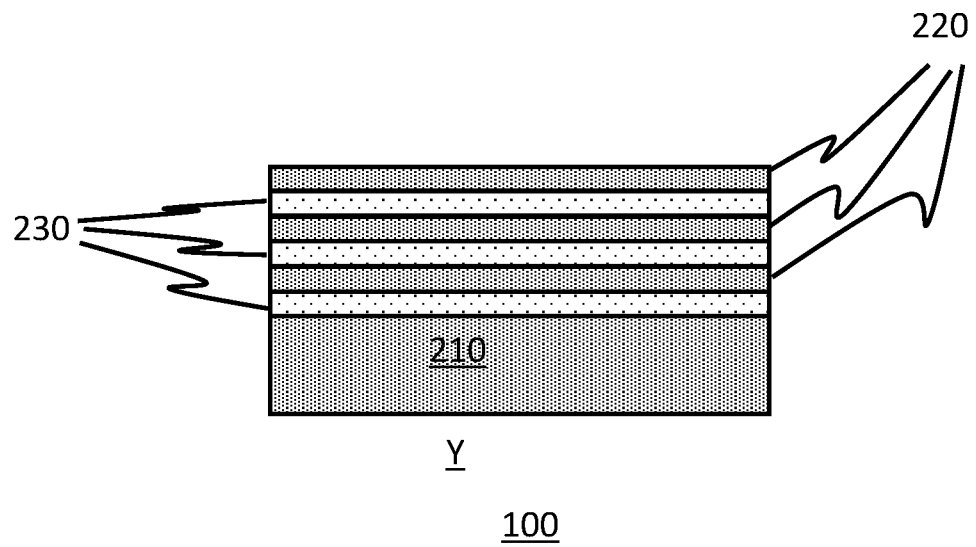
FIG. 2 provides a cross-sectional view of a step in the fabrication of a semiconductor device, according to an embodiment of the invention. The figure illustrates the formation of stacks of nanosheets of alternating materials.

FIG. 2 provides a schematic view of a device 100 according to an embodiment of the invention following the deposition, a stack of layers for the formation of CMOS device horizontal nanosheets. In an embodiment, the stack includes alternating layers of epitaxially grown silicon germanium 230, and silicon 220. Other materials having similar properties may be used in place of the SiGe and Si.

The terms "epitaxially growing and/or depositing" and "epitaxially grown and/or deposited" mean the growth of a semiconductor material on a deposition surface of a semiconductor material, in which the semiconductor material being grown has the same crystalline characteristics as the semiconductor material of the deposition surface. In an epitaxial deposition process, the chemical reactants provided by the source gases are controlled and the system parameters are set so that the depositing atoms arrive at the deposition surface of the semiconductor substrate with sufficient energy to move around on the surface and orient themselves to the crystal arrangement of the atoms of the deposition surface. Therefore, an epitaxial semiconductor material has the same crystalline characteristics as the deposition surface on which it is formed.

The nanosheet stack includes a bottom-most layer 230 of a first semiconductor material, such as SiGe and an intervening layer 220 of a second semiconductor material, such as Si. The nanosheet stack is depicted with six layers (three SiGe layers and three Si layers forming a device, however any number and combination of layers can be used so long as the layers alternate between SiGe and Si (or similar material) to form horizontal nanosheets. The nanosheet stack is depicted with the layers being in the form of nanosheets, however the width of any given nanosheet layer can be varied so as to result in the form of a nanowire, a nanoellipse, a nanorod, etc. SiGe layers 230, can be composed of, for instance, $SiGe_{20-60}$, examples thereof including, but not limited to $SiGe_{20}$, $SiGe_{25}$, $SiGe_{30}$ ... $SiGe_{65}$.

Substrate 210 can be composed of any currently known or later developed semiconductor material, which may include without limitation, silicon, germanium, silicon carbide, and those consisting essentially of one or more III-V compound semiconductors having a composition defined by the formula $Al_{X1}Ga_{X2}In_{X3}As_{Y1}P_{Y2}N_{Y3}Sb_{Y4}$, where X1, X2, X3, Y1, Y2, Y3, and Y4 represent relative proportions, each greater than or equal to zero and X1+X2+X3+Y1+Y2+Y3+Y4=1 (1 being the total relative mole quantity). Other suitable substrates include II-VI compound semiconductors having a composition $Zn_{A1}Cd_{A2}Se_{B1}Te_{B2}$, where A1, A2, B1, and B2 are relative proportions each greater than or equal to zero and A1+A2+B1+B2=1 (1 being a total mole quantity). An insulating layer (not shown) may be present on substrate 110 and, if present, is located between substrate 110 and the nanosheet stack. The insulating layer can be, for example, a buried oxide layer (typically $SiO_2$) or a bottom dielectric isolation layer formed early in the process (typically SiN, SiBCN, SiOCN, SiOC, or any combination of low-k materials).

In an embodiment, each sacrificial semiconductor material layer 230, is composed of a first semiconductor material which differs in composition from at least an upper portion of the semiconductor substrate 110. In one embodiment, the upper portion of the semiconductor substrate 210 is composed of silicon, while each sacrificial semiconductor material layer 230 is composed of a silicon germanium alloy. In one example, the SiGe alloy that provides each sacrificial semiconductor material layer 230 has a germanium content from 20 atomic percent germanium to 40 atomic percent germanium. The first semiconductor material that provides each sacrificial semiconductor material layers 230 can be formed utilizing an epitaxial growth from substrate 210 (or a deposition process).

Each semiconductor channel material layer 220, is composed of a second semiconductor material that has a different etch rate than the first semiconductor material of the sacrificial semiconductor material layers 230. The second semiconductor material of each semiconductor channel material layer 220, may be the same as, or different from, the semiconductor material of at least the upper portion of the semiconductor substrate 210. the first semiconductor material is different from the second semiconductor material.

In one example, at least the upper portion of the semiconductor substrate 210 and each semiconductor channel material layer 220 is composed of Si or a III-V compound semiconductor, while each sacrificial semiconductor material layer 230, is composed of a silicon germanium alloy. The second semiconductor material of each semiconductor channel material layer 220, can be formed utilizing an epitaxial growth (or deposition process).

Figure 3:
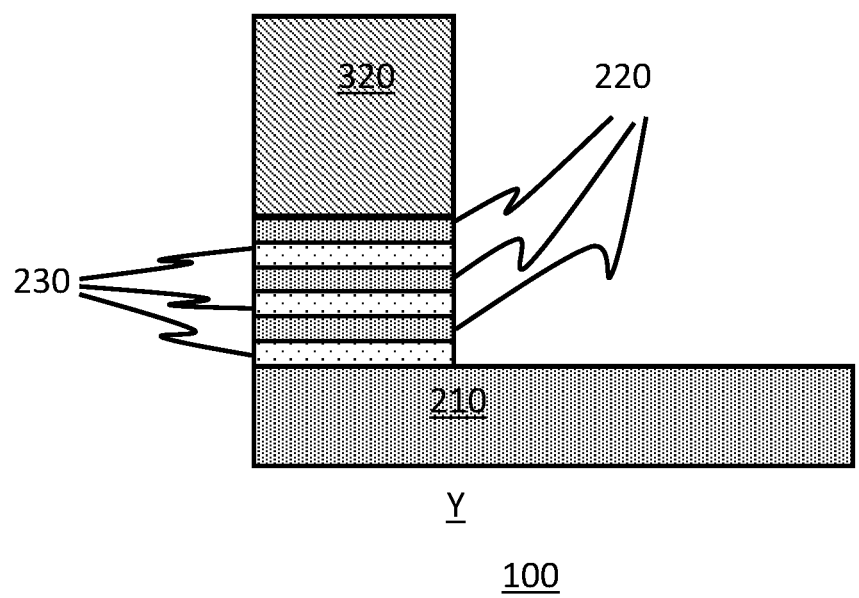
FIG. 3 provides a cross-sectional view of a step in the fabrication of a semiconductor device, according to an embodiment of the invention. The figure illustrates the device after the masking and selective recessing of the nanosheet stacks.

FIG. 3 illustrates device 100 following deposition of protective hardmask 320 and the masking a subsequent removal of portions of hardmask 320 as well as underlying portions of sacrificial layers 230 and channel layers 220. These material portions are masked using a lithographic masking process to deposit a protective layer above those portions to be retained followed by etching away of unprotected portions. Etching continues until the upper surface of substrate 210 is reached.

In an embodiment, hardmask 320 includes a nitride, oxide, an oxide-nitride bilayer, or another suitable material. In some embodiments, the hardmask 320 may include an oxide such as silicon oxide (SiO), a nitride such as silicon nitride (SiN), an oxynitride such as silicon oxynitride (SiON), combinations thereof, etc. In some embodiments, the hardmask 320 is a silicon nitride such as $Si_3N_4$.

Figure 4:
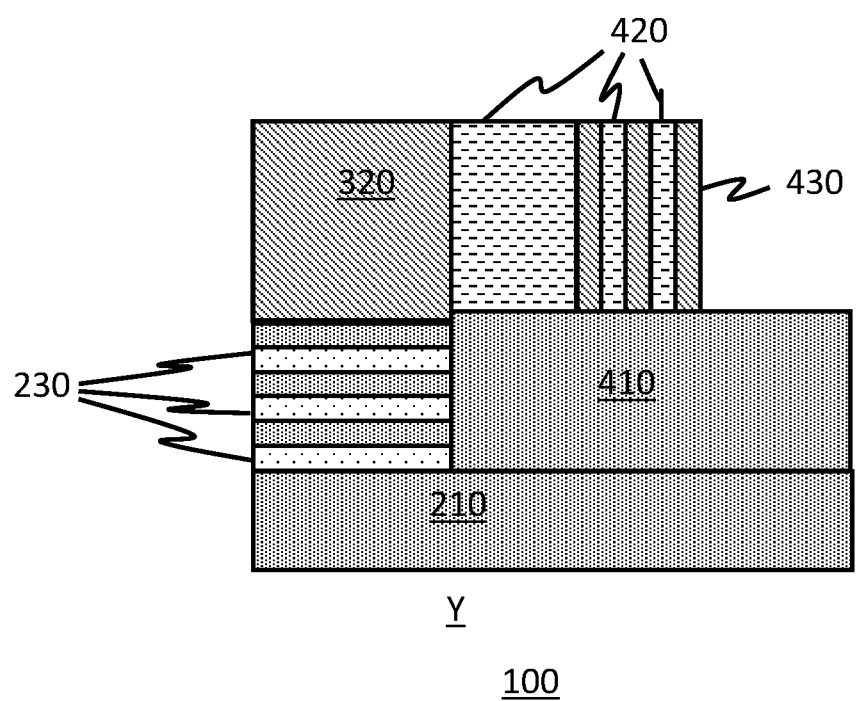
FIG. 4 provides a cross-sectional view, of a step in the fabrication of a semiconductor device, according to an embodiment of the invention. The figure illustrates the device after the growth of crystalline semiconductor material and the formation of alternating sacrificial and protective layers.

FIG. 4 illustrates device 100 following the epitaxial growth of additional material 410 from substrate 210 to a height near that of the upper channel layer 220. This material comprises crystalline semiconductor lattice similar to the materials of substrate 210 and channel layers 220. The figure further illustrates device 100 following the formation of alternating sacrificial layers 420 and hardmask spacers 430. Additional material 410 may be grown to the level of upper channel layer 220 or slightly above that level. Following this growth, a wide sacrificial spacer 420 is formed through deposition or epitaxial growth from the additional material 410. The material of wide spacer 420 is masked and etched to define a border or edge between the nFET and pFET devices of the CMOS pair. Following the etching of wide spacer 420, alternating hardmask 430 and sacrificial layers 420 are formed through alternating deposition—etching processes. These alternating layers comprise thicknesses similar to those of sacrificial layers 230 and channel layers 220, such that the spacing or pitch of the hardmask layers 430 is similar to the spacing or pitch of the channel layers 220. In an embodiment, hardmask layers 430 comprise a material similar to that of hardmask 320. In an embodiment, sacrificial layers 420 comprise a material such as SiGe, $AlO_x$, $TiO_x$, etc.

Figure 5:
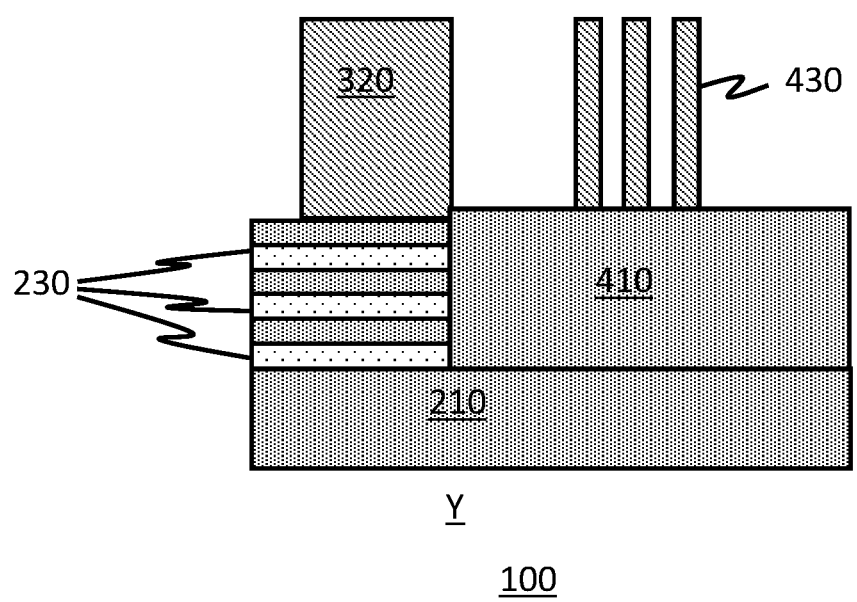
FIG. 5 provides a cross-sectional view of a step in the fabrication of a semiconductor device, according to an embodiment of the invention. The figure illustrates the device after the removal of sacrificial layers and the masking and patterning of the nFET hard mask layer.

FIG. 5 illustrates device 100 following the removal of sacrificial spacers 420 as well as the masking and selective etching for the removal of a portion of hardmask 320, thereby exposing portions of nanosheets 220 and 230. Removal of sacrificial material 420 proceeds until all material is removed exposing underlying material 410.

Etching generally refers to the removal of material from a substrate (or structures formed on the substrate) and is often performed with a mask in place so that material may selectively be removed from certain areas of the substrate, while leaving the material unaffected, in other areas of the substrate.

There are generally two categories of etching, (i) wet etch and (ii) dry etch. Wet etch is performed with a solvent (such as an acid) which may be chosen for its ability to selectively dissolve a given material (such as oxide), while, leaving another material (such as polysilicon) relatively intact. This ability to selectively etch given materials is fundamental to many semiconductor fabrication processes. A wet etch will generally etch a homogeneous material (e.g., oxide) isotropically, but a wet etch may also etch single-crystal materials (e.g. silicon wafers) anisotropically. Dry etch may be performed using a plasma. Plasma systems can operate in several modes by adjusting the parameters of the plasma. Ordinary plasma etching produces energetic free radicals, neutrally charged, that react at the surface of the wafer. Since neutral particles attack the wafer from all angles, this process is isotropic. Ion milling, or sputter etching, bombards the wafer with energetic ions of noble gases which approach the wafer approximately from one direction, and therefore this process is highly anisotropic. Reactive-ion etching (RIE) operates under conditions intermediate between sputter and plasma etching.

Figure 6:
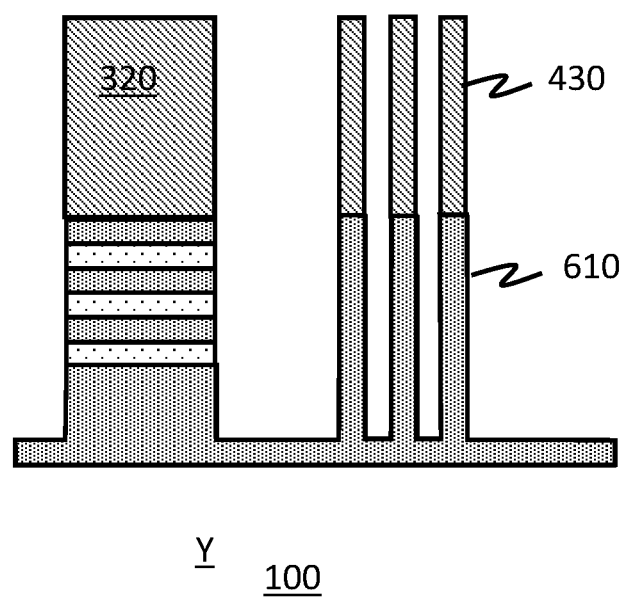
FIG. 6 provides a cross-sectional view of a step in the fabrication of a semiconductor device, according to an embodiment of the invention. The figure illustrates the device after the formation of vertical nanosheets and the recessing of the nFET layer stack.

FIG. 6 illustrates device 100 following selective etching of additional material 410 as well as portions of substrate 210 to form vertical nanosheets 610 for the ultimate pFET device. In an embodiment, anisotropic etching selectively etches the exposed horizontal surfaces of the crystalline semiconductor material.

Figure 7:
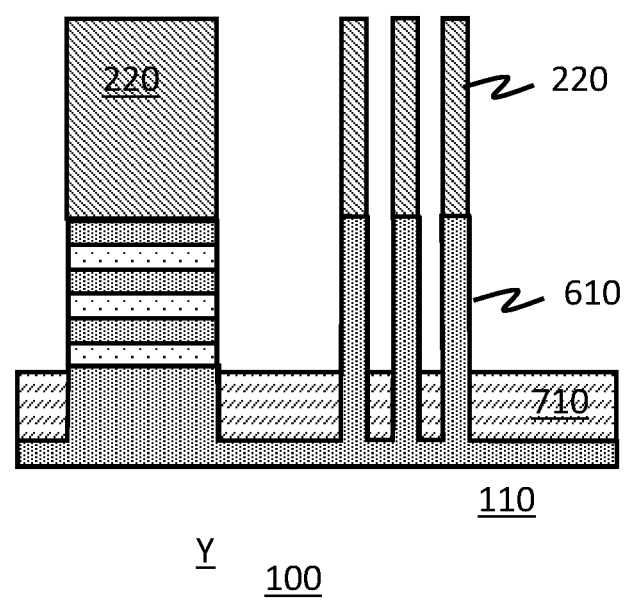
FIG. 7 provides a cross-sectional view of a step in the fabrication of a semiconductor device, according to an embodiment of the invention. The figure illustrates the device after the deposition of shallow trench isolation materials.

FIG. 7 illustrates device 100 following the deposition and CMP of a shallow trench isolation (STI) material 710. In an embodiment, STI materials include silicon dioxide, or any suitable combination of multiple dielectric materials (e.g., silicon nitride and silicon oxide).

Figure 8:
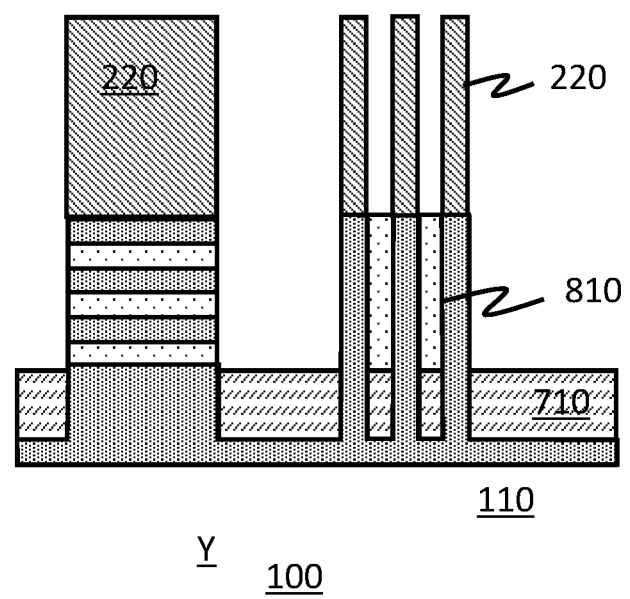
FIG. 8 provides a cross-sectional view of a step in the fabrication of a semiconductor device, according to an embodiment of the invention. The figure illustrates the device after the growth and etch back of sacrificial spacer materials between vertical nanosheets.

FIG. 8 illustrates device 100 following the deposition and etch back of sacrificial spacer material 810 between vertical nanosheets 610. In an embodiment, spacer material 810 comprises SiGe materials similar to those of sacrificial layers 230. In this embodiment, the spacer material is epitaxially grown from the vertical nanosheet 610 and excess growth is then removed by an isotropic selectively etching process to leave the desired spacers 810.

Figure 9:
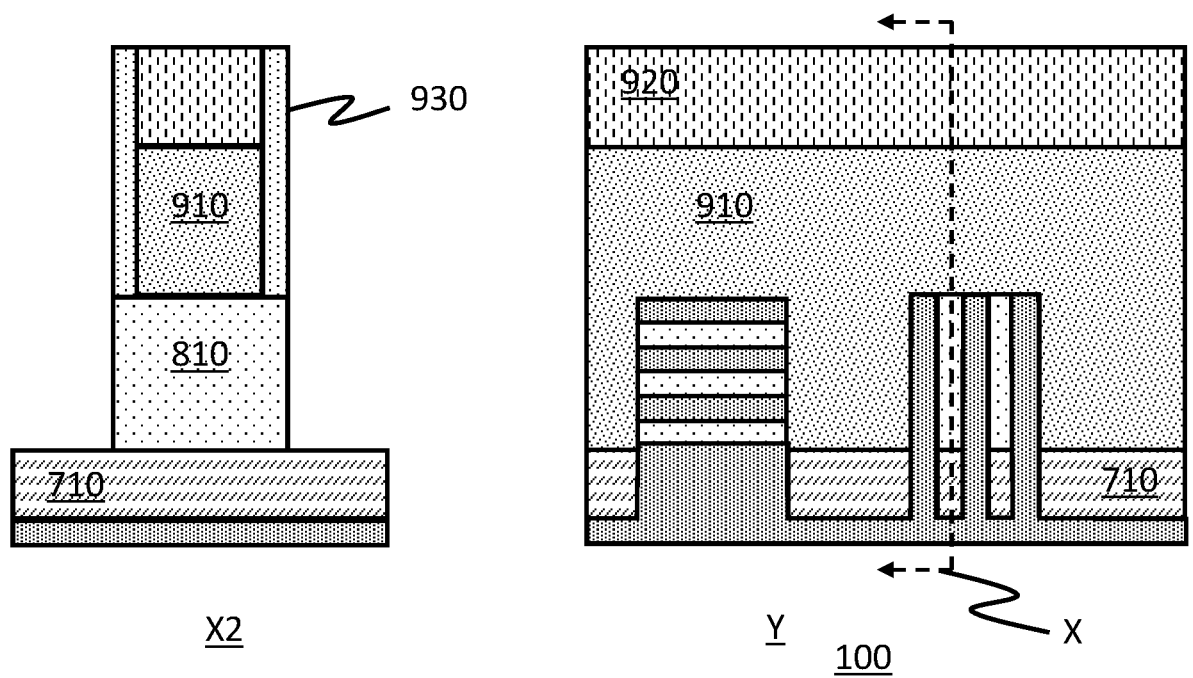
FIG. 9 provides a cross-sectional view of a step in the fabrication of a semiconductor device, according to an embodiment of the invention. The figure illustrates the device after the formation of a dummy gate structure around the nanosheets.

FIG. 9 illustrates device 100 following the formation of dummy gate structures including dummy gate 910, sacrificial cap 920 and gate sidewall spacers 930. As shown in the figure, a dummy gate structure including dummy gate 910 and protective sidewall spacers 930 has been formed above the nanosheet stack. In some embodiments, the dummy gate includes a dummy gate dielectric (e.g., silicon oxide) and a dummy gate placeholder (e.g., amorphous silicon). The dummy gate may further comprise hardmask layer 920 (e.g., silicon nitride) at the top. After depositing the dummy gate stack, it is patterned (e.g., by RIE). The protective sidewall spacers 930 may comprise any suitable dielectric material(s), for example, such as $Si_3N_4$, SiBCN, SiNC, SiN, SiCO, $SiO_2$, SiNOC, etc. The sidewall spacers 930 can be formed by deposition upon the dummy gate structure followed by RIE. In some embodiments, the lateral width of each spacer is about 6 nm. The combination of the dummy gate 910 and sidewall spacers 930 defines a channel width as illustrated in view X2 of FIG. 9 after selective etching to remove portions of sacrificial layers 230 and channel layers 220 disposed between adjacent gate locations. In an embodiment, RIE selectively removes those portions of sacrificial layers 230 and channel layers 220.

Figure 10:
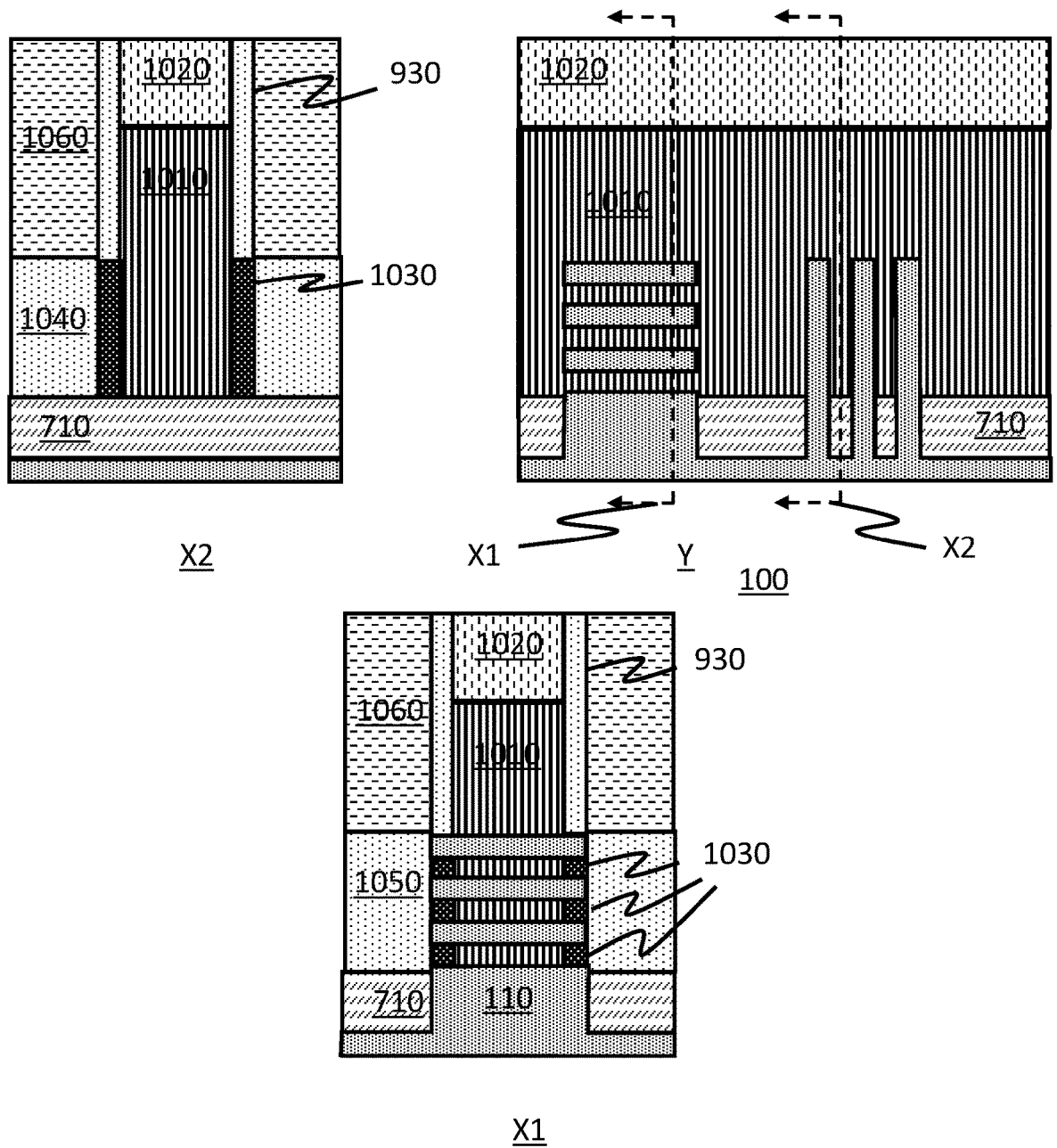
FIG. 10 provides a cross-sectional view of a step in the fabrication of a semiconductor device, according to an embodiment of the invention. The figure illustrates the device after the formation of a high-k metal gate structure.

FIG. 10 illustrates device 100 following the removal of the dummy gate structure and the formation of the replacement high-k metal gate, including the formation of inners spacers between the horizontal and vertical nanosheets to isolate the high-k metal gate from ultimate epitaxially grown device source-drain regions.

As shown in the Figure, after generally etching the nanosheet stack to the cross section of the dummy gate 910 and sidewall gate spacers 930, a selective etching of SiGe layers 230 of the horizontal nanosheet stack, and the SiGe spacers 810 of the vertical nanosheet stack, removes portions which are underneath gate sidewall spacers 930. Inner spacers 1030 are then formed in the etched portions between nanosheets and thus are located under gate sidewall spacers 930. Inner spacers 1030 can be composed of any suitable dielectric material, for example $Si_3N_4$, SiBCN, SiNC, SiN, SiCO, $SiO_2$, SiNOC, etc. In an embodiment, the inner spacers 1030 are formed by a conformal dielectric liner deposition followed by isotropic etching back, so dielectric liner is removed everywhere except the regions pinched-off in those under spacer cavities.

FIG. 10 further illustrates device 100 following the formation of the replacement metal gate, including the formation of inners spacers between the horizontal and vertical nanosheets to isolate the high-k metal gate from ultimate epitaxially grown device source-drain regions.

After epitaxial growth and selective recessing of electrically isolated, separately doped pFET 1040, and nFET 1050, source drain regions, together with the encapsulation of the source drain regions with an interlayer dielectric material 1060, the dummy gate structure is replaced with a high-k metal gates structure.

In an embodiment, the source-drain regions 1040, 1050, may be doped in situ by adding one or more dopant species to the epitaxial material. The dopant used will depend on the type of FET being formed, whether p-type or n-type. As used herein, "p-type" refers to the addition of impurities to an intrinsic semiconductor that creates deficiencies of valence electrons. In a silicon-containing semiconductor, examples of p-type dopants, i.e., impurities, include but are not limited to boron, aluminum, gallium and indium. As used herein, "n-type" refers to the addition of impurities that contributes free electrons to an intrinsic semiconductor. In a silicon containing substrate, examples of n-type dopants, i.e., impurities, include but are not limited to antimony, arsenic and phosphorous.

FIG. 10 illustrates device 100 following the removal of dummy gate 910, sacrificial SiGe 230, 8100, and formation of the high-k metal gate (HKMG) stack 1010, and a protective gate dielectric cap 1020. As shown in the Figure, a replacement metal gate structure has been formed in the void space created by removal of the dummy gate 910, hardmask 920, and sacrificial SiGe layers 230 and 810 from between the nanosheets. Gate structure 1010 includes gate dielectric and gate metal layers (not shown). The gate dielectric is generally a thin film and can be silicon oxide, silicon nitride, silicon oxynitride, boron nitride, SiOCN, SiBCN, SiOC, SiCN, high-k materials, or any combination of these materials. Examples of high-k materials include but are not limited to metal oxides such as hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, and lead zinc niobate. The high-k materials may further include dopants such as lanthanum, aluminum, magnesium. Gate dielectric can be deposited by CVD, ALD, or any other suitable technique. Metal gate can include any known metal gate material known to one skilled in the art, e.g., TiN, TiAl, TiC, TiAlC, tantalum (Ta) and tantalum nitride (TaN), W, Ru, Co, Al. Metal gate 610 may be formed via known deposition techniques, such as atomic layer deposition, chemical vapor deposition, or physical vapor deposition. It should be appreciated that a chemical mechanical planarization (CMP) process can be applied to the top surface.

In an embodiment, the replacement metal gate 1010 includes work-function metal (WFM) layers, (e.g., titanium nitride, titanium aluminum nitride, titanium aluminum carbide, titanium aluminum carbon nitride, and tantalum nitride) and other appropriate metals and conducting metal layers (e.g., tungsten, cobalt, tantalum, aluminum, ruthenium, copper, metal carbides, and metal nitrides). After formation and CMP of the HKMG, the HKMG can be optionally recessed followed by the deposition and CMP of a gate dielectric material 1020, to complete the replacement metal gate fabrication stage for the device.

As shown in view X1 of FIG. 10, inner spacers 1030 provide isolation between HKMG 1010, and nFET S/D regions 1050. As shown in view X2 of FIG. 10, inner spacers 1030 provide isolation between HKMG 1010 and pFET S/D regions 1040.

FIGS. 11-15 illustrate fabrication of embodiments including a bottom dielectric isolation layer providing isolation between device source/drain regions to prevent current leakage between such regions.

Figure 11:
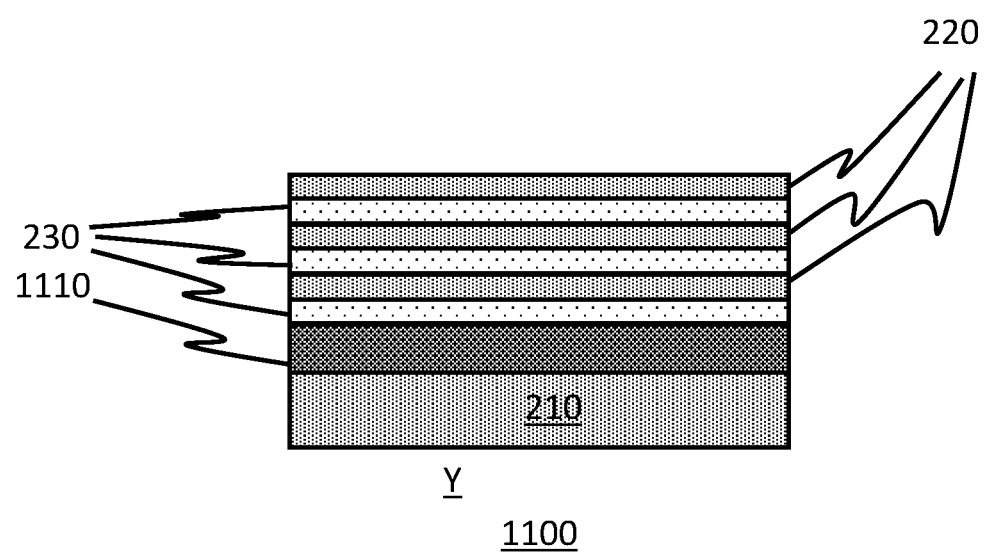
FIG. 11 provides a cross-sectional view of a step in the fabrication of a semiconductor device, according to an embodiment of the invention. The figure illustrates the nanosheet layers of an alternative embodiment of the structure.

FIG. 11 illustrates device 1100 following epitaxial growth of a stack of alternating layers similar to those of FIG. 2. FIG. 1 further illustrates sacrificial layer 1110 beneath the other layers. In an embodiment, sacrificial layer 1110 comprising a material such as SiGe having a higher Ge concentration that that of sacrificial layers 230. Sacrificial layer 1110 enables the epitaxial growth of subsequent layers while the relatively higher Ge content enables selective removal of this layer at an appropriate stage of fabrication without also removing portions of sacrificial layers 230.

Figure 12:
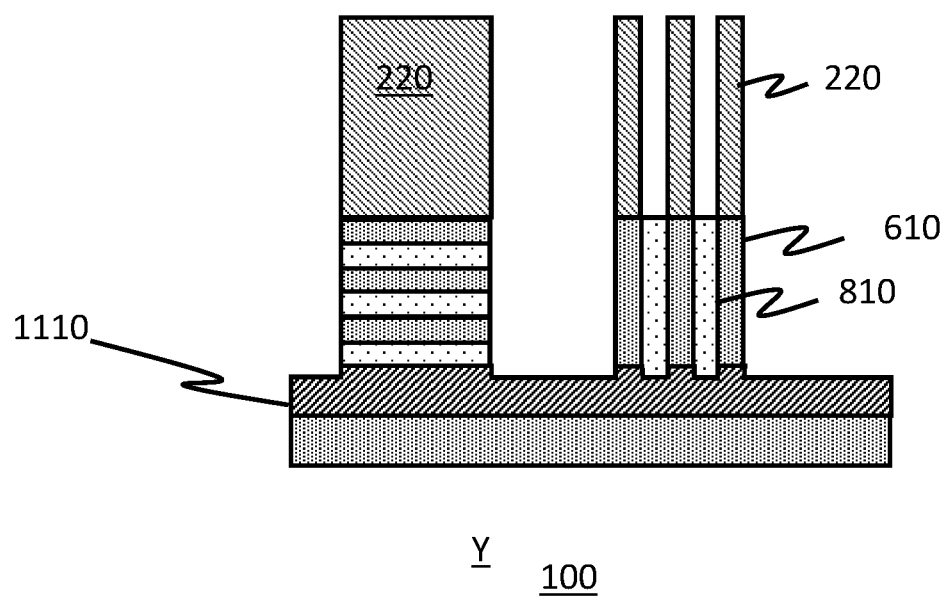
FIG. 12 provides a cross-sectional view of a step in the fabrication of a semiconductor device, according to an embodiment of the invention. The figure illustrates the alternative structure after the formation of the vertical nanosheets.

FIG. 12 illustrates device 1100 following formation of the vertical nanosheets 610 and the deposition of sacrificial spacers 810 between these nanosheets 610 as described above with regard to FIG. 8. FIG. 12 further illustrates the selective etching of sacrificial layer 1110 to form the desired cross-section for the bottom dielectric isolation layer.

Figure 13:
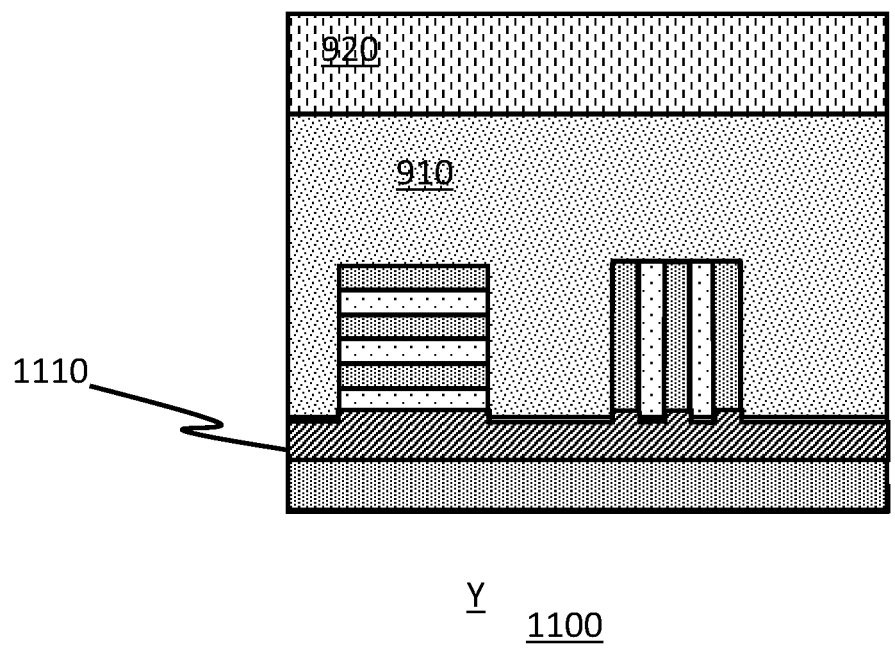
FIG. 13 provides a cross-sectional view of a step in the fabrication of a semiconductor device, according to an embodiment of the invention. The figure illustrates the alternative structure after formation of a dummy gate structure.

FIG. 13 illustrates device 1100 following formation of dummy gate 910 and sacrificial cap 920, above sacrificial layer 1110. As described above with regard to FIG. 9.

Figure 14:
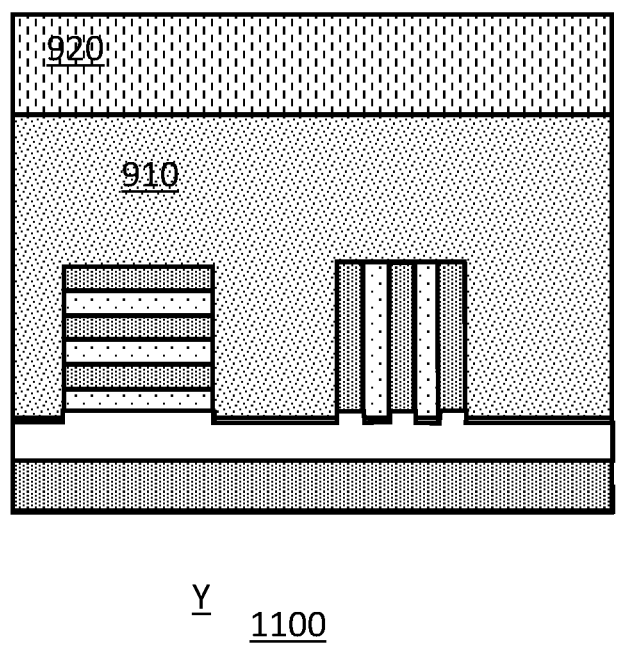
FIG. 14 provides a cross-sectional view of a step in the fabrication of a semiconductor device, according to an embodiment of the invention. The figure illustrates the device after the removal a bottom sacrificial layer.

FIG. 14 illustrates device 1100 following removal of sacrificial layer 1110 from beneath the dummy gate 910 and nanosheet stacks of the device. Selective etching may be used to remove sacrificial layer 1110 without disturbing sacrificial layers 230 and 810.

Figure 15:
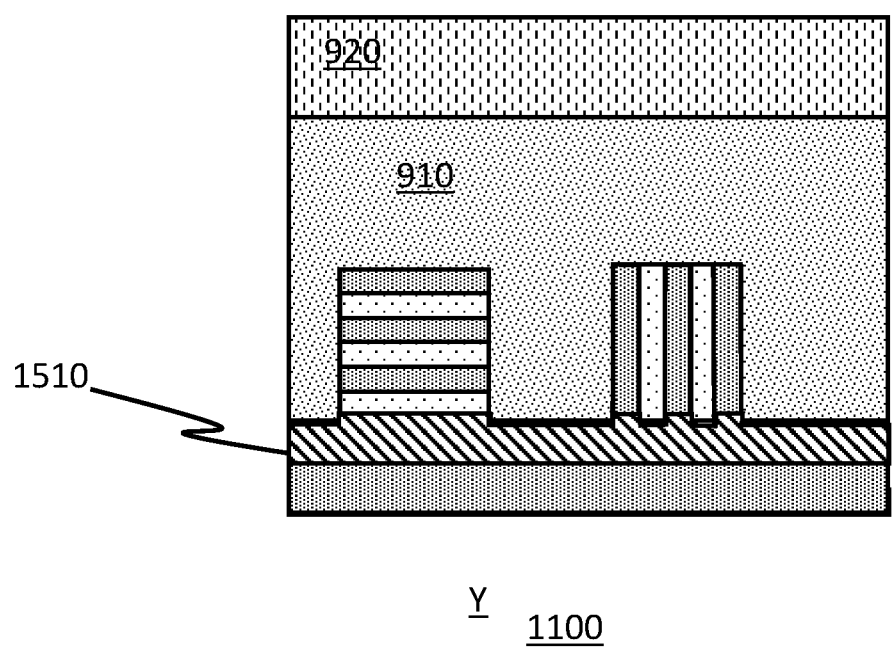
FIG. 15 provides a cross-sectional view of a step in the fabrication of a semiconductor device, according to an embodiment of the invention. The figure illustrates the device after the formation of a bottom dielectric isolation layer.

FIG. 15 illustrates device 1100 following deposition of bottom dielectric material 1510, such as silicon dioxide, or similar material, in the void space left following the removal of sacrificial layer 1110.

Fabrication of device 1100 proceeds as described above following the deposition of the bottom dielectric isolation spacer. Source drain regions for the nFET and pFET are formed, the replacement metal gate is formed in place of the dummy gate as described above. The device is encapsulated in interlayer dielectric and gate and S/D contacts are formed through vias in the ILD to the gate and S/D portions of the device. Additional back-end-of-line processes follow the completion of the device fabrication.

Figure 16:
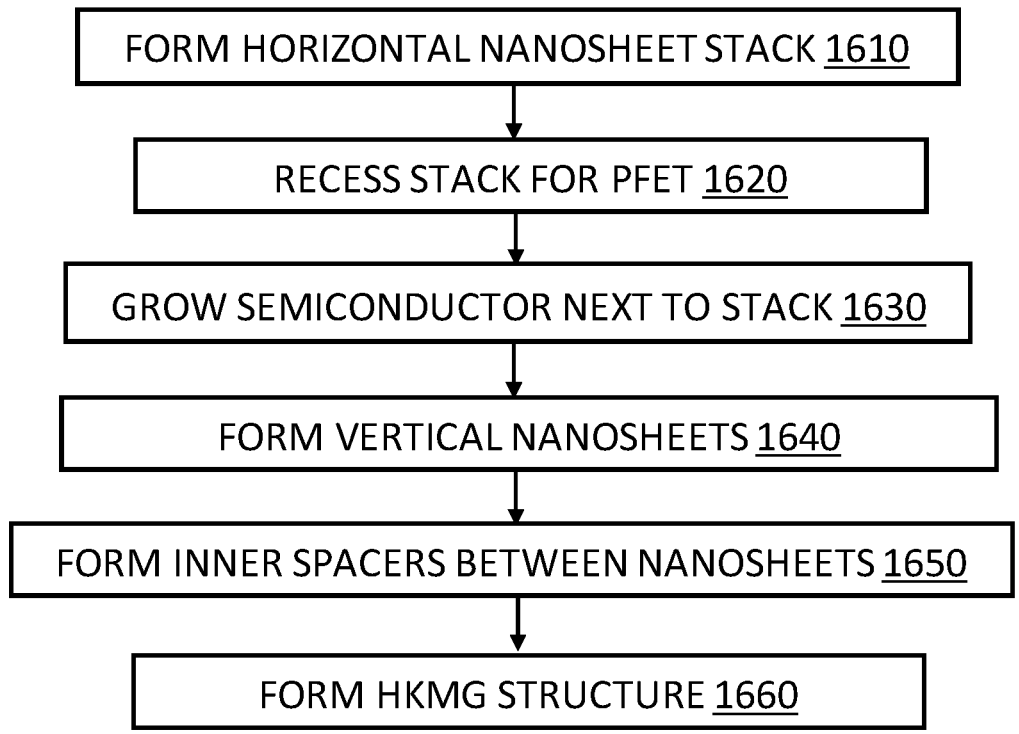
FIG. 16 provides a flowchart depicting operational steps for forming semiconductor device, according to an embodiment of the invention.

FIG. 16 provides a flowchart 1600 of exemplary fabrication steps associated with an embodiment of the invention. At block 1610, a stack of horizontal nanosheet layers is formed on an underlying substrate. The stack of layers includes alternating sacrificial semiconductor layers and semiconductor channel layers epitaxially grown on the substrate and then upon each preceding layer.

At block 1620, the stack of nanosheet layers is recessed to a point defined by the ultimate nFET edge closest to the pFET of the device. Recessing the nanosheet stack creates space for the formation of the vertical pFET nanosheets as described below.

At block 1630 additional semiconductor material similar to that of the substrate and/or the nFET channel layers is epitaxially grown from the substrate exposed by recessing the nanosheet layers.

At block 1640 vertical nanosheets are formed by the deposition of an nFET-pFET spacer above the new semiconductor growth followed by the successive deposition of alternating sacrificial layers and hardmask layers adjacent to the nFET-pFET spacer.

At block 1650 inner spacers are formed between the horizontal and vertical nanosheets. The inner spacers occupy a portion of the space between the nanosheets leaving a portion of the space for HKMG formation between the nanosheets.

At block 1660 the formation of the HKMG around and between the channel layers together with the growth of source-drain regions completes this stage of device fabrication.

The flowchart and block diagrams in the figures illustrate the architecture, functionality, and operation of possible implementations of systems, methods, and device fabrication steps according to various embodiments of the present invention. In this regard, each block in the flowchart or block diagrams may represent a module, segment, or portion of instructions, which comprises one or more fabrication steps for manufacturing the specified device(s). In some alternative implementations, the functions noted in the blocks may occur out of the order noted in the Figures. For example, two blocks shown in succession may, in fact, be executed substantially concurrently, or the blocks may sometimes be executed in the reverse order, depending upon the functionality involved.

References in the specification to "one embodiment", "an embodiment", "an example embodiment", etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

The descriptions of the various embodiments of the present invention have been presented for purposes of illustration but are not intended to be exhaustive or limited to the embodiments disclosed. Many modifications and variations will be apparent to those of ordinary skill in the art without departing from the scope and spirit of the invention. The terminology used herein was chosen to best explain the principles of the embodiment, the practical application or technical improvement over technologies found in the marketplace, or to enable others of ordinary skill in the art to understand the embodiments disclosed herein.

What is claimed is:

1. A semiconductor structure comprising:
a first field effect transistor (FET), the first FET comprising a first plurality of semiconductor channel nanosheets having a horizontal orientation and a first separation pitch between the first plurality of semiconductor channel nanosheets;
a second FET disposed adjacent to the first FET, the second FET comprising a second plurality of semiconductor channel nanosheets having a vertical orientation and a second separation pitch between the second plurality of semiconductor channel nanosheets, with first inner dielectric spacers disposed between the second plurality of nanosheets wherein each such first inner dielectric spacer is disposed in contact with two otherwise adjacent vertical nanosheets; and
wherein the first separation pitch is similar to the second separation pitch.

2. The semiconductor structure according to claim 1, wherein the second FET comprises p-type FET doped source drain regions.

3. The semiconductor structure according to claim 1, further comprising second inner dielectric spacers between the first plurality of semiconductor channel nanosheets.

4. The semiconductor structure according to claim 1, further comprising a bottom dielectric isolation layer disposed beneath the first FET and the second FET.

5. The semiconductor structure according to claim 1, wherein the first separation pitch comprises between about 10 nm to about 15 nm.

6. The semiconductor structure according to claim 1, further comprising inner spacers between the first plurality of nanosheets.

7. The semiconductor structure according to claim 1, wherein the plurality of vertical nanosheets comprises a height about three times the second separation pitch.

8. A semiconductor structure comprising:
an n-type field effect transistor (nFET), the nFET comprising a plurality of horizontal semiconductor channel nanosheets disposed at a first pitch separating the plurality of semiconductor channel nanosheets; and
a p-type FET (pFET), the pFET comprising a plurality of vertical semiconductor channel nanosheets disposed at the first pitch and having first inner dielectric spacers disposed between the plurality of vertical nanosheets, wherein each such first inner dielectric spacer is disposed in contact with two otherwise adjacent vertical nanosheets.

9. The semiconductor structure according to claim 8 wherein the nFET and pFET have similar effective semiconductor channel nanosheet widths (Weff).

10. The semiconductor structure according to claim 8, further comprising second inner dielectric spacers between the nFET plurality of nanosheets.

11. The semiconductor structure according to claim 8, further comprising a bottom dielectric isolation layer disposed beneath the nFET and the pFET.

12. The semiconductor structure according to claim 8, wherein the first pitch comprises between about 10 nm to about 15 nm.

13. The semiconductor structure according to claim 8, further comprising inner spacers between the nFET plurality of nanosheets.

14. The semiconductor structure according to claim 8, wherein the plurality of vertical nanosheets comprises a height about three times the first pitch.

* * * * *